(12) United States Patent
Pan et al.

(10) Patent No.: US 7,366,041 B2
(45) Date of Patent: *Apr. 29, 2008

(54) INPUT BUFFER FOR LOW VOLTAGE OPERATION

(75) Inventors: Dong Pan, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/703,500

(22) Filed: Feb. 7, 2007

(65) Prior Publication Data

US 2007/0140028 A1    Jun. 21, 2007

Related U.S. Application Data

(63) Continuation of application No. 11/158,243, filed on Jun. 21, 2005, now Pat. No. 7,206,234.

(51) Int. Cl.
G11C 7/00 (2006.01)

(52) U.S. Cl. .................. 365/194; 365/189.05; 365/207; 327/77

(58) Field of Classification Search ................ 365/194, 365/189.05, 207; 327/77
See application file for complete search history.

(56) References Cited

U.S. PATENT DOCUMENTS

| 4,135,160 | A | 1/1979 | Gagliani |
|---|---|---|---|
| 4,146,844 | A | 3/1979 | Quinn |
| 4,341,963 | A | 7/1982 | Jensen et al. |
| 4,468,628 | A | 8/1984 | Gross |
| 4,703,285 | A | 10/1987 | Woo |
| 4,717,837 | A | 1/1988 | Garuts |
| 4,723,112 | A | 2/1988 | Diller et al. |
| 4,748,420 | A | 5/1988 | Metz |
| 5,349,302 | A | 9/1994 | Cooper |
| 5,373,469 | A | 12/1994 | Akioka et al. |
| 5,663,925 | A | 9/1997 | Vo |
| 5,757,697 | A | 5/1998 | Briner |
| 5,835,411 | A | 11/1998 | Briner |
| 5,862,077 | A | 1/1999 | Briner |
| 5,874,830 | A | 2/1999 | Baker |
| 5,940,608 | A | 8/1999 | Manning |
| 6,026,051 | A | 2/2000 | Keeth et al. |
| 6,046,942 | A | 4/2000 | Hwang et al. |
| 6,097,632 | A | 8/2000 | Roohparvar |
| 6,104,209 | A | 8/2000 | Keeth et al. |
| 6,108,237 | A | 8/2000 | Briner |
| 6,140,877 | A | 10/2000 | Forbes |
| 6,222,770 | B1 | 4/2001 | Roohparvar |
| 6,249,185 | B1 | 6/2001 | O'Toole et al. |
| 6,256,234 | B1 | 7/2001 | Keeth et al. |
| 6,282,138 | B1 | 8/2001 | Wilkins |
| 6,288,954 | B1 | 9/2001 | Manning |
| 6,289,476 | B1 | 9/2001 | Cowles |

(Continued)

*Primary Examiner*—Richard T. Elms
*Assistant Examiner*—Nam Nguyen
(74) *Attorney, Agent, or Firm*—Schwegman, Lundberg & Woessner, P.A.

(57) ABSTRACT

An input buffer having differential amplifiers for receiving input signals to generate an output signal. The input buffer operates with a relatively low supply voltage and a relatively wide range of input signal levels while improving the symmetry between rising and falling signal transitions of the output signal.

30 Claims, 7 Drawing Sheets

U.S. PATENT DOCUMENTS

| | | |
|---|---|---|
| 6,340,904 B1 | 1/2002 | Manning |
| 6,346,858 B1 | 2/2002 | Forbes |
| 6,377,084 B1 | 4/2002 | Forbes |
| 6,407,955 B2 | 6/2002 | Manning |
| 6,456,556 B1 | 9/2002 | Huber |
| 6,472,939 B2 | 10/2002 | Forbes |
| 6,512,400 B1 | 1/2003 | Forbes |
| 6,522,160 B1 | 2/2003 | Zivanovic |
| 6,525,967 B1 | 2/2003 | Briner |
| 6,529,417 B2 | 3/2003 | Roohparvar |
| 6,545,510 B1 | 4/2003 | Cowles |
| 6,552,596 B2 | 4/2003 | Cowles et al. |
| 6,597,600 B2 | 7/2003 | Baker |
| 6,665,826 B2 | 12/2003 | Cowles |
| 6,693,485 B1 | 2/2004 | Huber |
| 6,700,416 B2 | 3/2004 | Cowles |
| 6,741,121 B2 | 5/2004 | Huber |
| 6,744,673 B2 | 6/2004 | Briner |
| 6,753,801 B2 | 6/2004 | Rossi |
| 6,771,553 B2 | 8/2004 | Cowles et al. |
| 6,801,061 B2 | 10/2004 | Cowles |
| 6,816,994 B2 | 11/2004 | Schoenfeld et al. |
| 6,847,582 B2 | 1/2005 | Pan |
| 6,856,532 B2 | 2/2005 | Baker |
| 6,864,725 B2 | 3/2005 | Cowles et al. |
| 6,868,024 B2 | 3/2005 | Pekny |
| 7,042,794 B2 * | 5/2006 | Kim ...................... 365/230.06 |
| 7,206,234 B2 * | 4/2007 | Pan et al. .................... 365/194 |
| 2002/0166948 A1 | 11/2002 | Rossi |
| 2003/0071659 A1 | 4/2003 | Forbes |
| 2003/0090287 A1 | 5/2003 | Zivanovic |
| 2004/0170078 A1 | 9/2004 | Briner |
| 2004/0222351 A1 | 11/2004 | Rossi |
| 2006/0285406 A1 | 12/2006 | Pan et al. |

* cited by examiner

INPUT BUFFER FOR LOW VOLTAGE OPERATION

RELATED APPLICATIONS

This application is a Continuation of U.S. application Ser. No. 11/158,243, filed Jun. 21, 2005, now U.S. Pat. No. 7,206,234 which is incorporated herein by reference.

FIELD

This disclosure relate to circuits that produce output signals based on differences in signal levels between multiple input signals.

BACKGROUND

Input buffers reside in many electrical devices such as memory devices and processors to receive input signals. The input signals may represent data. In some devices, the value of the data is determined by the voltage difference between voltage levels of the input signals. The input buffers detect the voltage difference and generate an output signal that reflects the value of the data.

Most conventional input buffers are designed to operate at some specified values for operating parameters such as supply voltage range, process variations, temperature range, input signal voltage swing, and input signal slew rate.

Changes in one or more of the operating parameters, for example a lower supply voltage and a smaller input signal swing, may cause some of the conventional input buffers to generate the output signal with poor symmetry between rising and falling signal transitions. Changes in the operating parameters may also cause some conventional input buffers to stop function.

DETAILED DESCRIPTION

Figure 1:
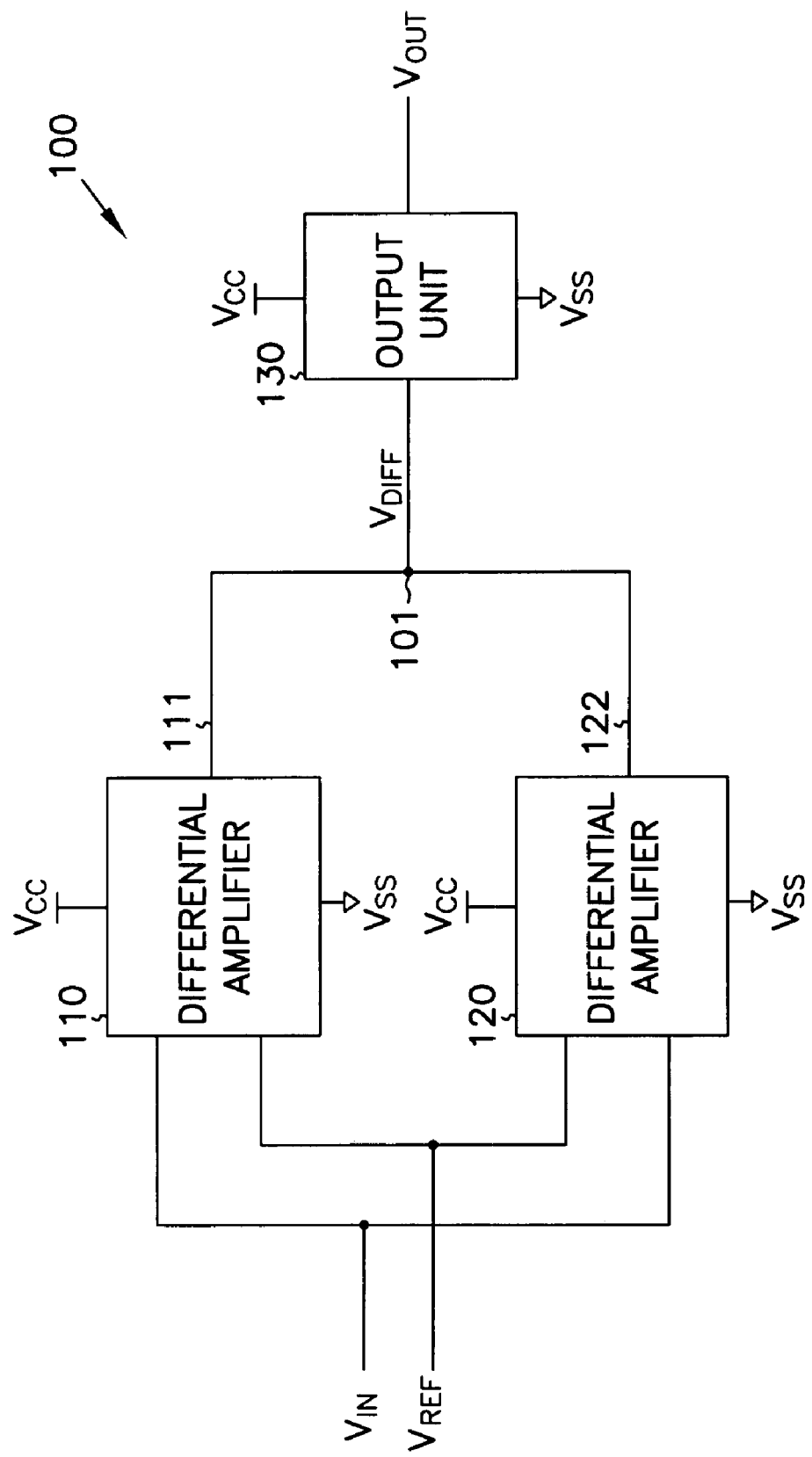
FIG. 1 shows an input buffer having multiple differential amplifiers according to an embodiment of the invention.

The following description and the drawings illustrate specific embodiments of the invention sufficiently to enable those skilled in the art to practice the embodiments of the invention. Other embodiments may incorporate structural, logical, electrical, process, and other changes. In the drawings, like labels and numerals describe substantially similar components throughout the several views. Examples merely typify possible variations. Portions and features of some embodiments may be included in or substituted for those of others. The scope of the invention encompasses the claims and all available equivalents.

FIG. 1 shows an input buffer having multiple differential amplifiers according to an embodiment of the invention. Input buffer 100 includes differential amplifiers 110 and 120, and an output unit 130. Differential amplifiers 110 and 120 respond to the same pair of input signals $V_{REF}$ and $V_{IN}$ to provide a signal $V_{DIFF}$ at node 101. Node 101 is a combined output node formed by a combination of an output node 111 of differential amplifier 110 and an output node 122 of differential amplifier 120. Output unit 130 generates a signal $V_{OUT}$ based on the $V_{DIFF}$ signal. The $V_{OUT}$ and $V_{DIFF}$ signals are considered as the output signals of input buffer 100.

In some embodiments, input buffer 100 is used in an electrical device to receive data in which the difference (offset) between the signal levels of the $V_{IN}$ and $V_{REF}$ signals represents the value of the data such as a logic one or a logic zero. In some embodiments, the $V_{REF}$ signal is fixed at a reference signal level and the $V_{IN}$ signal switches or swings between different signal levels. In these embodiments, the value of the data is determined by the signal level of the $V_{IN}$ signal relative to the reference signal level of the $V_{REF}$ signal. For example, the value of the data is a logic one when the signal level of the $V_{IN}$ signal is higher than the signal level of the $V_{REF}$ signal; and the value of the data is a logic zero when the signal level of the $V_{IN}$ signal is lower than the signal level of the $V_{REF}$ signal. In some embodiments, the $V_{REF}$ signal is fixed at a reference signal level and the $V_{IN}$ signal has a signal level that is about 75 millivolts to 150 millivolts higher or lower than the reference signal level of the $V_{REF}$ signal.

Input buffer 100 uses differential amplifiers 110 and 120 to compare the signal levels of the $V_{IN}$ and $V_{REF}$ signals to interpret the value of a data. Differential amplifiers 110 and 120 set the signal level of the $V_{DIFF}$ signal at node 101 to reflect the result of the comparison. For example, differential amplifiers 110 and 120 set the $V_{DIFF}$ signal to a first signal level (e.g., low) when $V_{IN}$ is higher than $V_{REF}$ and to a second signal level (e.g., high) when $V_{IN}$ is lower than $V_{REF}$. Thus, the $V_{DIFF}$ signal switches between different signal levels (low and high) to represent different values (logic one and logic zero) of the data. Since the $V_{OUT}$ signal is generated from the $V_{DIFF}$ signal, the $V_{OUT}$ signal also switches when the $V_{DIFF}$ signal switches. In some embodiments, the $V_{OUT}$ signal switches between $V_{CC}$ and $V_{SS}$ where $V_{CC}$ is the supply voltage of input buffer 100 and $V_{SS}$ is ground. In some embodiments, output unit 130 performs an inverting function such that the $V_{OUT}$ signal is an inversion of the $V_{DIFF}$ signal.

Differential amplifiers 110 and 120 operate independently but cause a similar effect to the $V_{DIFF}$ signal at node 101 based on the same condition of the $V_{IN}$ and $V_{REF}$ signals. For example, when differential amplifier 110 sets the $V_{DIFF}$ signal to a high signal level, differential amplifier 120 also sets the $V_{DIFF}$ signal to high signal level. In some embodiments, differential amplifier 110 is a p-channel differential amplifier where p-channel transistors are used to receive the $V_{IN}$ and $V_{REF}$ signals; and differential amplifier 120 is an n-channel differential amplifier where n-channel transistors are used to receive the $V_{IN}$ and $V_{REF}$ signals. The combination of both p-channel and n-channel differential amplifiers allows input buffer 100 to operate with a relatively wider voltage range of the $V_{REF}$ signal. The combination of both p-channel and n-channel differential amplifiers also improves the symmetry between rising and falling times of the $V_{OUT}$ signal in both low-to-high transition and high-to-low transition of the $V_{IN}$ signal. The rising time of the $V_{OUT}$ signal refers to the time when the $V_{OUT}$ signal to switches from a low signal level to a high signal level. The falling time of the $V_{OUT}$ signal refers to the time when the $V_{OUT}$ signal to switch from the high signal level to the low signal level.

In some embodiments, at least one of the differential amplifiers 110 and 120 includes multiple transistor pairs to receive the same $V_{IN}$ and $V_{REF}$. In these embodiments, the multiple transistor pairs have different threshold voltages and have a circuit arrangement to improve the supply voltage range of input buffer 100 and the symmetry between the rising and falling times of the $V_{OUT}$ signal.

Figure 2:
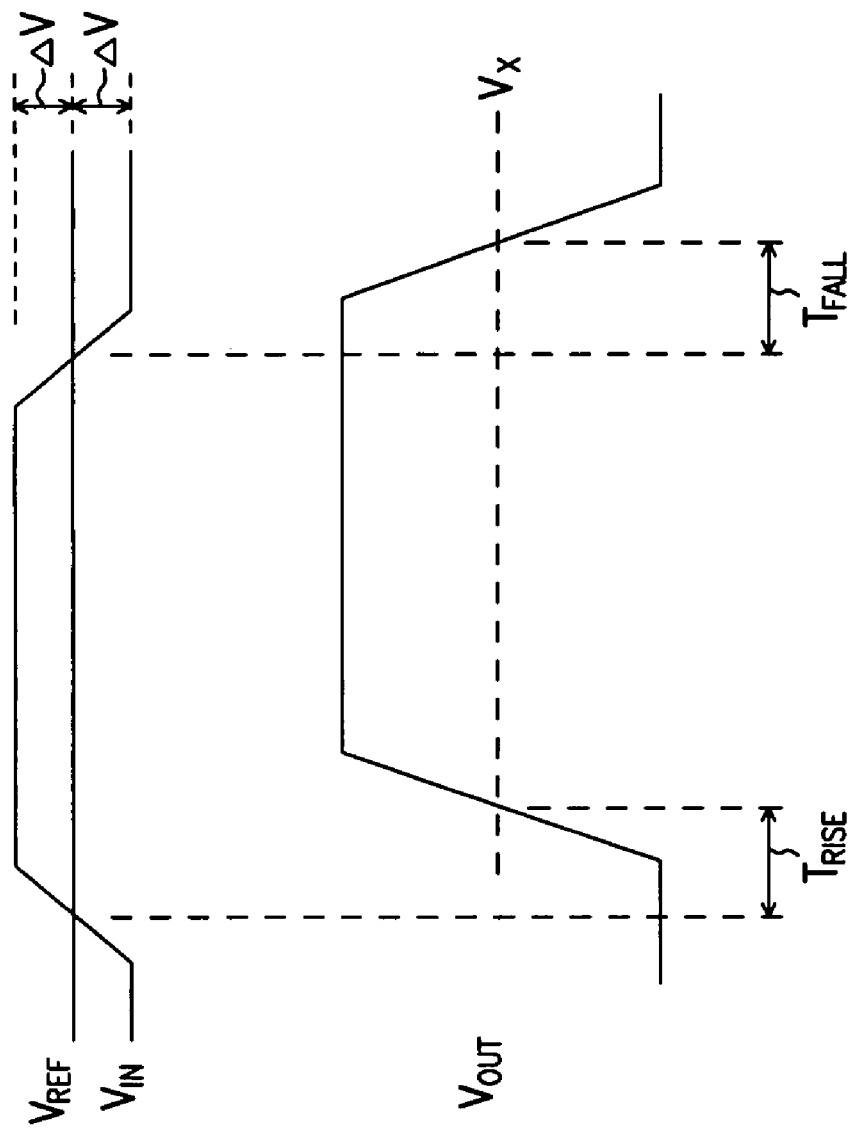
FIG. 2 is an exemplary timing diagram for FIG. 1.

FIG. 2 is an exemplary timing diagram for FIG. 1. In FIG. 2, delta V ($\Delta V$) represents the difference or offset between the input signals $V_{IN}$ and $V_{REF}$. Thus, the voltage level of the $V_{IN}$ signal is either higher or lower than the voltage of the $V_{REF}$ signal by $\Delta V$. $T_{RISE}$ represents the rising time of the $V_{OUT}$ signal. $T_{FALL}$ represents the falling time of the $V_{OUT}$ signal. As shown in FIG. 2, when the $V_{IN}$ signal switches from low to high, $T_{RISE}$ is the difference between the point where the $V_{IN}$ signal crosses the $V_{REF}$ signal and the point where the $V_{OUT}$ signal crosses $V_X$. In some embodiments, $V_X$ is about one-half $V_{CC}$. In FIG. 2, when the $V_{IN}$ signal switches from high to low, $T_{FALL}$ is the difference between the point where the $V_{IN}$ signal crosses the $V_{REF}$ signal and the point where the $V_{OUT}$ signal crosses $V_X$.

In some embodiments, input buffer 100 of FIG. 1 is configured to operate at a supply voltage $V_{CC}$ in a range of about 1.2 to 1.75 volts and $\Delta V$ in a range of about 75 millivolts to 500 millivolts. In some of these embodiments, the rising and falling times of the $V_{OUT}$ signal are generally symmetrical such that the difference between $T_{FALL}$ and $T_{RISE}$ is about 200 picoseconds or less.

Figure 3:
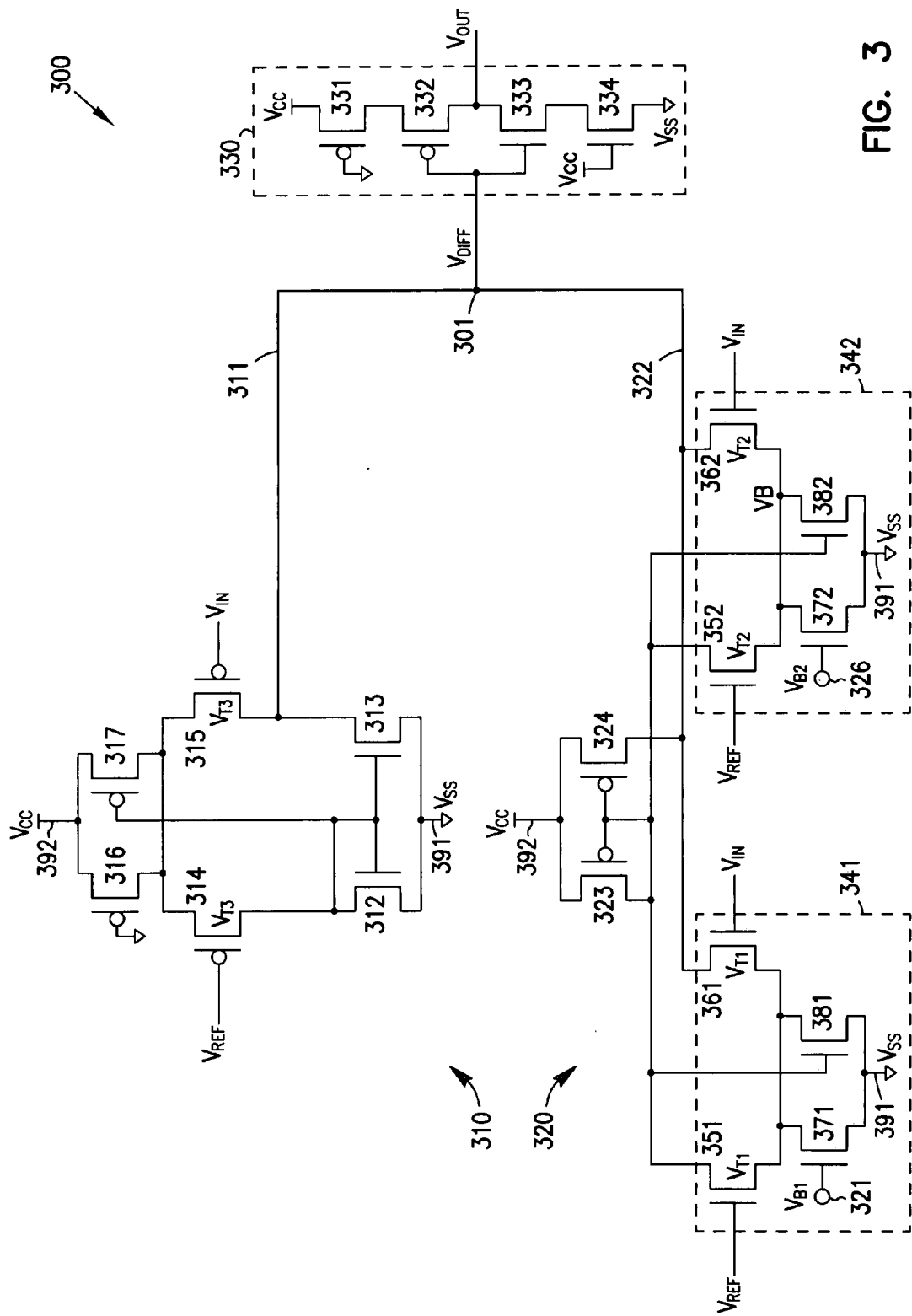
FIG. 3 shows an input buffer having transistors with different threshold voltages according to an embodiment of the invention.

FIG. 3 shows an input buffer having transistors with different threshold voltages according to an embodiment of the invention. Input buffer 300 includes a p-channel differential amplifier 310 and an n-channel differential amplifier 320. In some embodiments, differential amplifiers 310 and 320 corresponds to differential amplifiers 110 and 120 of FIG. 1. In FIG. 3, differential amplifiers 310 and 320 respond to input signals $V_{REF}$ and $V_{IN}$ to provide a $V_{DIFF}$ signal at a combined output node 301. Node 301 is formed by a combination of an output node 311 of differential amplifier 310 and an output node 322 of differential amplifier 320. Output unit 330 includes transistors 331, 332, 333, and 334 forming an inverter to invert the $V_{DIFF}$ signal to generate the $V_{OUT}$ signal. In some embodiments, output buffer 330 includes multiple inverters connected in series to perform the inversion of the $V_{DIFF}$ signal. The $V_{OUT}$ and $V_{DIFF}$ signals are considered as the output signals of input buffer 300.

Differential amplifiers 310 and 320 operate independently but cause a similar effect to the $V_{DIFF}$ signal at node 301 based on the same condition of the $V_{IN}$ and $V_{REF}$ signals. For example, when differential amplifier 310 sets the $V_{DIFF}$ signal to a high signal level, differential amplifier 320 also sets the $V_{DIFF}$ signal to a high signal level.

In FIG. 3, the $V_{REF}$ signal remains substantially fixed at a reference signal level while the $V_{IN}$ signal switches between different signal levels, above and below the reference signal level. Differential amplifiers 310 and 320 switch the $V_{DIFF}$ signal from a low signal level to a high signal level when the $V_{IN}$ signal switches to a signal level lower than the reference signal level of the $V_{REF}$ signal. Differential amplifiers 310 and 320 switch the $V_{DIFF}$ signal from the high signal level to the low signal level when the $V_{IN}$ signal switches to a signal level higher than the reference signal level of the $V_{REF}$ signal. The $V_{DIFF}$ signal is subsequently inverted to provide the $V_{OUT}$ signal.

Differential amplifier 310 includes a pair of load transistors 312 and 313 coupled to a supply node 391, a pair of input transistors 314 and 315 having a threshold voltage $V_{T3}$. Input transistors 314 and 315 are p-channel transistors. Differential amplifier 310 includes further includes a bias unit formed by bias transistors 316 and 317.

Differential amplifier 320 includes a pair of load transistors 323 and 324 with a shared source coupled to a supply node 392, a first switching circuit 341 and a second switching circuit 342 coupled to load transistors 323 and 324 and supply node 391. Switching circuit 341 includes a pair of input transistors 351 and 361 having a threshold voltage $V_{T1}$, and a bias unit formed by bias transistors 371 and 381. Switching circuit 342 includes a pair of input transistors 352 and 362 having a threshold voltage $V_{T2}$, and a bias unit formed by bias transistors 372 and 382. Input transistors 351, 361, 352, and 362 are n-channel transistors. The threshold voltage $V_{T2}$ is lower than the threshold voltage $V_{T1}$. In some embodiments, $V_{T2}$ is a fraction of $V_{T1}$. In other embodiments, $V_{T2}$ is about two-thirds (⅔) of $V_{T1}$. In some other embodiments, $V_{T2}$ is about 0.4 volt and $V_{T1}$ is about 0.68 volt.

Each of the differential amplifiers 310 and 320 is self-biased. In differential amplifier 310, transistor 316 and 317 provide the self-biasing. In differential amplifier 320, transistors 371, 381, 372, and 382 provide the self-biasing. As shown in FIG. 3, the gate of transistor 317 is connected to a shared gate of a current mirror load formed by transistors 312 and 313 to provide self-biasing to differential amplifier 310. Similarly, the gate of each of the transistors 381 and 382 is coupled to a shared gate of a current mirror load formed by transistors 323 and 324 to provide self-biasing to differential amplifier 320.

The gate of transistor 371 is coupled to a bias node 321 to receive a bias voltage $V_{B1}$. $V_{B1}$ is an adjustable voltage such that the bias current in switching circuit 341 is adjustable using different values of $V_{B1}$. Adjusting bias current allows input buffer 300 to be adjusted based on different operating conditions to improve the operation of input buffer 300. In some embodiments, bias node 321 is connected to the supply voltage of input buffer 300 such that $V_{B1}$ is about $V_{CC}$. In other embodiments, bias node 321 is connected to a programmable device such that $V_{B1}$ is a programmable voltage. In some other embodiments, bias node 321 is connected to a variable voltage generator such that $V_{B1}$ is a variable voltage.

The gate of transistor 372 is coupled to a bias node 326 to receive a bias voltage $V_{B2}$. $V_{B2}$ is an adjustable voltage such that the bias current in switching circuit 342 is adjustable using different values of $V_{B2}$. Adjusting bias current allows input buffer 300 to be adjusted based on different operating conditions to improve the operation of input buffer 300. In some embodiments, bias node 326 is connected to the supply voltage of input buffer 300 such that $V_{B2}$ is about $V_{CC}$. In other embodiments, bias node 326 is connected to a programmable device such that $V_{B2}$ is a programmable voltage. In some other embodiments, bias node 326 is connected to a variable voltage generator such that $V_{B2}$ is a variable voltage.

Both switching circuits 341 and 342 receive the same input signals $V_{IN}$ and $V_{REF}$. Switching circuits 341 and 342 serve a similar function, which is to switch the value of the $V_{DIFF}$ signal between a high signal level and a low signal level when the $V_{IN}$ signal switches between different signal levels. Although switching circuits 341 and 342 serve a similar function, the difference in the threshold voltages ($V_{T1}$ and $V_{T2}$) of the transistors of switching circuits 341 and 342 allows the $V_{DIFF}$ signal to consistently switch between high and low voltage values under a wide range of the $V_{REF}$ signal and a low supply voltage $V_{CC}$. The consistent high and low voltage values are sufficient to allow output unit 330 to maintain the symmetry between the rising time and falling time of the $V_{OUT}$ signal.

The following first example and second example show exemplary operations of input buffer 300 with a relatively low supply voltage $V_{CC}$ and different voltage values of $V_{REF}$. The first example shows input buffer 300 operating with a supply voltage $V_{CC}$ of about 1.2 volts and $V_{REF}$ of about 0.75 volt. The second example shows input buffer 300 operating with a supply voltage $V_{CC}$ of about 1.2 volts and a higher $V_{REF}$ of about 1.0 volt. For clarity, the first and second examples mainly show the effect at node 301 ($V_{DIFF}$) caused mainly by the action in differential amplifier 320. The action in differential amplifier 310 affects the $V_{DIFF}$ signal at node 301 in a similar fashion. In the following examples, $V_{T1}$ of transistors 351 and 361 has an exemplary value of about 0.68 volt; $V_{T2}$ of transistors 352 and 362 has an exemplary value of about 0.4 volt.

In the first example, where $V_{CC}$ is about 1.2 volts and $V_{REF}$ is about 0.75 volt, transistors 351 and 361 almost turn off, the $V_{DIFF}$ signal is affected mostly by the action of transistors 352 and 362. In this example, when the $V_{IN}$ signal switches, the $V_{DIFF}$ signal switches between a high signal level ($V_{DIFF}$ high) and a low signal level ($V_{DIFF}$ low).

$V_{DIFF}$ high is approximately equal to $V_{CC}$ or about 1.2 volts.

$V_{DIFF}$ low is approximately determined from the expression (1) below:

$$V_{DIFF}\text{low}=VB=V_{REF}-V_{T2}-V_{DELTA}.$$

The voltage drop between the source and drain of transistor 362 is assumed to be zero. $V_{DELTA}$ is the "overhead" or "overdrive" voltage which is about 0.05 volt.

By substituting $V_{REF}$ of 0.75 volt and $V_{T2}$ of 0.4 volt into expression (1) above, $V_{DIFF}$ low=0.75−0.4−0.05=0.3 volt.

Thus, in this example, the $V_{DIFF}$ signal switches between a $V_{DIFF}$ high of about 1.2 and a $V_{DIFF}$ low of about 0.3 volt. The high and low voltages of the $V_{DIFF}$ signal in the this example are sufficient to allow output unit 330 to switch the $V_{OUT}$ signal such that the rising and falling times of the $V_{OUT}$ signal are generally symmetrical. For example, $V_{DIFF}$ high of 1.2 volts allows output unit 330 to switch the $V_{OUT}$ signal from a high signal level to a low signal level (high-to-low) with a fall time interval ($T_{FALL}$); $V_{DIFF}$ low of 0.3V allows output unit 330 to switch the $V_{OUT}$ signal from the low signal level to the high signal level (low-to-high) with a rise time interval ($T_{RISE}$). In this example, the 1.2 volts and 0.3 volt are sufficient enough to such that $T_{FALL}$ is similar or substantially equal to ($T_{RISE}$).

In the second example, where $V_{CC}$ is about 1.2 volts and $V_{REF}$ is about 1.0 volt, all transistors 351, 361, 352 and 362 turn on. In this example, when the $V_{IN}$ signal switches, the $V_{DIFF}$ signal also switches between $V_{DIFF}$ high $V_{DIFF}$ low. $V_{DIFF}$ high in this example is also approximately equal to $V_{CC}$ or about 1.2 volts. In this example, since all transistors 351, 361, 352 and 362 turn on, $V_{DIFF}$ low has two possible different values; a first value is caused by the action of transistor pair 351 and 361, a second value is caused by the action of the other transistor pair 352 and 362.

Each of the first and second values may be determined from the same expression (1) shown above: $V_{DIFF}$ low=$VB=V_{REF}-V_T-V_{DELTA}$ (where $V_T$ is either $V_{T1}$ or $V_{T2}$).

For the first value of $V_{DIFF}$ low, by substituting $V_{REF}$ of 1.0 volt and $V_{T2}$ of 0.4 volt into expression (1) above, $V_{DIFF}$ low=1.0−0.4−0.05=0.55 volt.

For the second value of $V_{DIFF}$ low, by substituting $V_{REF}$ of 1.0 volt and $V_{T1}$ of 0.68 volt into expression (1) above, $V_{DIFF}$ low=1.0−0.68−0.05=0.27 volt.

In this example, although the transistors with a lower threshold voltage (transistors 352 and 362) switch the $V_{DIFF}$ signal to a low signal level $V_{DIFF}$ low of 0.55 volt, the transistors with a higher threshold voltage (transistors 351 and 361) causes $V_{DIFF}$ to be at about 0.27 volt, which is lower than 0.55 volt.

Thus, in this second example, the $V_{DIFF}$ signal switches between a $V_{DIFF}$ high of about 1.2 and $V_{DIFF}$ low of about 0.27 volt. Similarly to the first example where $V_{REF}$ is about 0.75 volt, the high and low voltages of $V_{DIFF}$ (1.2 volt and 0.27 volt) in the second example are also sufficient to allow output unit 330 to switch the $V_{OUT}$ signal such that the rising and falling times of the $V_{OUT}$ signal are generally symmetrical.

Both of the first and second examples above show that with transistors having different threshold voltages and arranged as shown in FIG. 3, input buffer 300 allows the $V_{DIFF}$ signal to consistently switch between high and low voltage values under a wide range of the $V_{REF}$ signal and a low supply voltage $V_{CC}$ to maintain the symmetry between the rising time and falling time of the $V_{OUT}$ signal.

Some conventional input buffers may use a differential amplifier that has all transistors with the same threshold voltage, for example 0.68 volt. However, these conventional input buffers may suffer from a limited range of supply voltage. For example, conventional input buffers with all transistors having a threshold voltage of about 0.68 volt may not function when the supply voltage is at about 1.25 volts.

Some other conventional input buffers may use a differential amplifier having all transistors a lower threshold voltage, for example, 0.4 volt. These other conventional input buffers may function with a relatively lower supply voltage; however, they may suffer from a limited range of input reference signal and may also provide a non-symmetrical output signal. For example, when operating with a relatively high reference voltage, the conventional input buffers with all transistors having a threshold voltage of about 0.4 volt may switch the signal at the output nodes of the convention buffers between a high voltage level corresponding the supply voltage $V_{CC}$ and a low voltage of about 0.55 volt (such as $V_{DIFF}$ low of about 0.55 volt shown in the second example above). In this case, the high reference voltage and the low supply voltage may cause the output signal such as the $V_{OUT}$ signal to switch from low to high faster than to switch from high to low. This leads to a non-symmetric output signal and may degrade the performance of the conventional input buffers.

As shown in the examples above, using transistors with different threshold voltages ($V_{T1}$ and $V_{T2}$) allows input buffer 300 to operate at a relatively low supply voltage and at different voltage values of the $V_{REF}$ signal while providing a generally symmetrical output signal.

Figure 4:
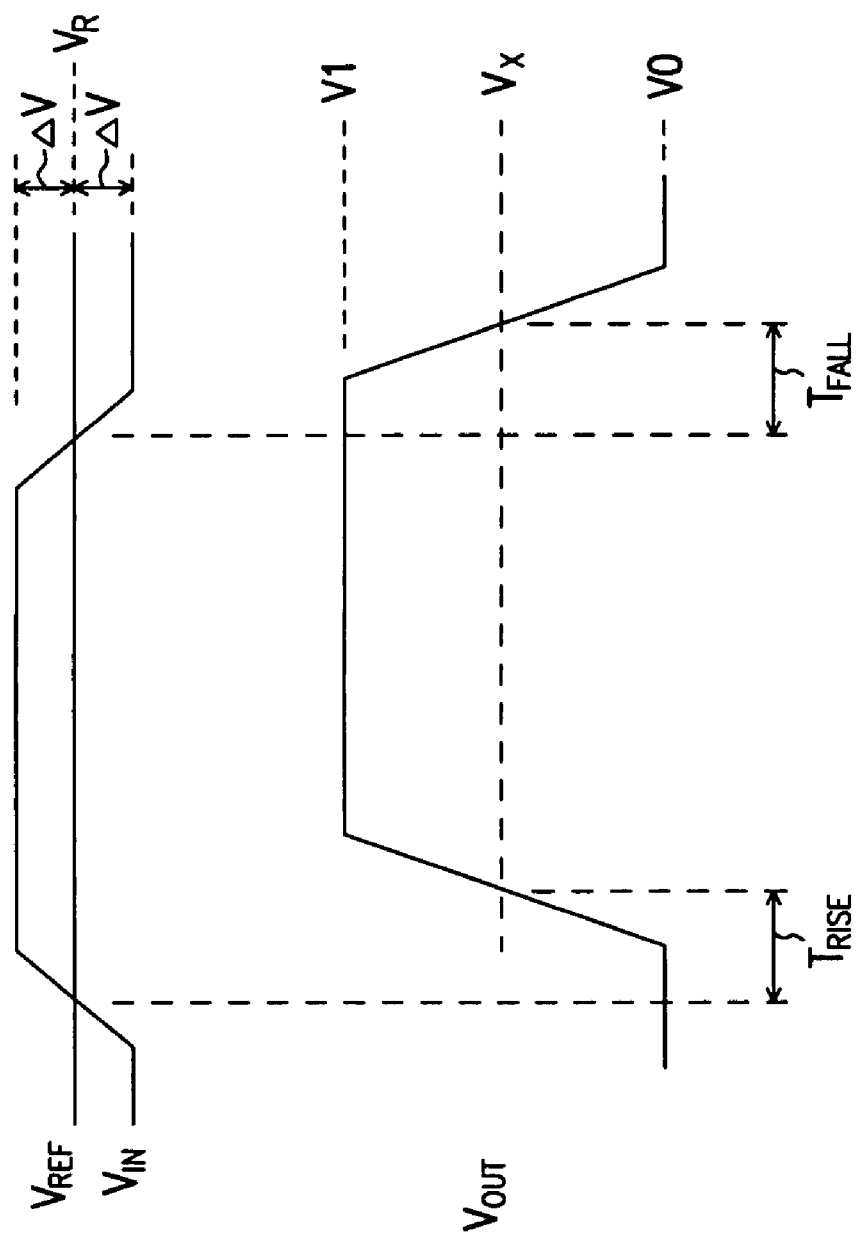
FIG. 4 is an exemplary timing diagram for FIG. 3.

FIG. 4 is an exemplary timing diagram for FIG. 3. In FIG. 4, V0, V1, and $V_R$ represent voltage levels. As shown in FIG. 2, the $V_{REF}$ signal remains at $V_R$. Delta V (ΔV) represents the difference or offset between $V_R$ and the signal levels of the $V_{IN}$ signal. Thus, the signal levels of the $V_{IN}$ signal is higher or lower than the signal level of the $V_{REF}$ signal by ΔV. The $V_{OUT}$ signal switches between V0 and V1. $T_{RISE}$ represents the rising time of the $V_{OUT}$ signal. $T_{FALL}$ represents the falling time of the $V_{OUT}$ signal. As shown in FIG.

4, when the $V_{IN}$ signal switches from low to high, $T_{RISE}$ is the difference between the point where the $V_{IN}$ signal crosses the $V_{REF}$ signal and the point where the $V_{OUT}$ signal crosses $V_X$. In some embodiments, $V_X$ is about one-half V1. In FIG. 4, when the $V_{IN}$ signal switches from high to low, $T_{FALL}$ is the difference between the point where the $V_{IN}$ signal crosses the $V_{REF}$ signal and the point where the $V_{OUT}$ signal crosses $V_X$. As discussed in FIG. 3, input buffer 300 operates at a relatively lower supply voltage and a relatively wider voltage range of the $V_{REF}$ signal while keeping the rising and falling times of the $V_{OUT}$ signal substantially symmetrical.

In some embodiments, V1 in FIG. 4 corresponds to a supply voltage ($V_{CC}$) of about 1.2 volts, $V_R$ corresponds to a reference signal level ($V_{REF}$) of about 0.9 volt, and $\Delta V$ is about 75 millivolts.

In other embodiments, V1 corresponds to a supply voltage ($V_{CC}$) of about 1.2 volts, $V_R$ corresponds to a reference signal level ($V_{REF}$) of about 0.9 volt, and $\Delta V$ is about 150 millivolts.

In some other embodiments, V1 corresponds to a supply voltage ($V_{CC}$) in a range of about 1.2 volts to about 1.75 volts, $V_R$ corresponds to a reference signal level ($V_{REF}$) in a range of about 0.6 volt to 1.1 volts, and $\Delta V$ is in a range of about 75 millivolts to about 500 millivolts.

In some embodiments, the difference between $T_{RISE}$ and $T_{FALL}$ is about 200 picoseconds or less.

Figure 5:
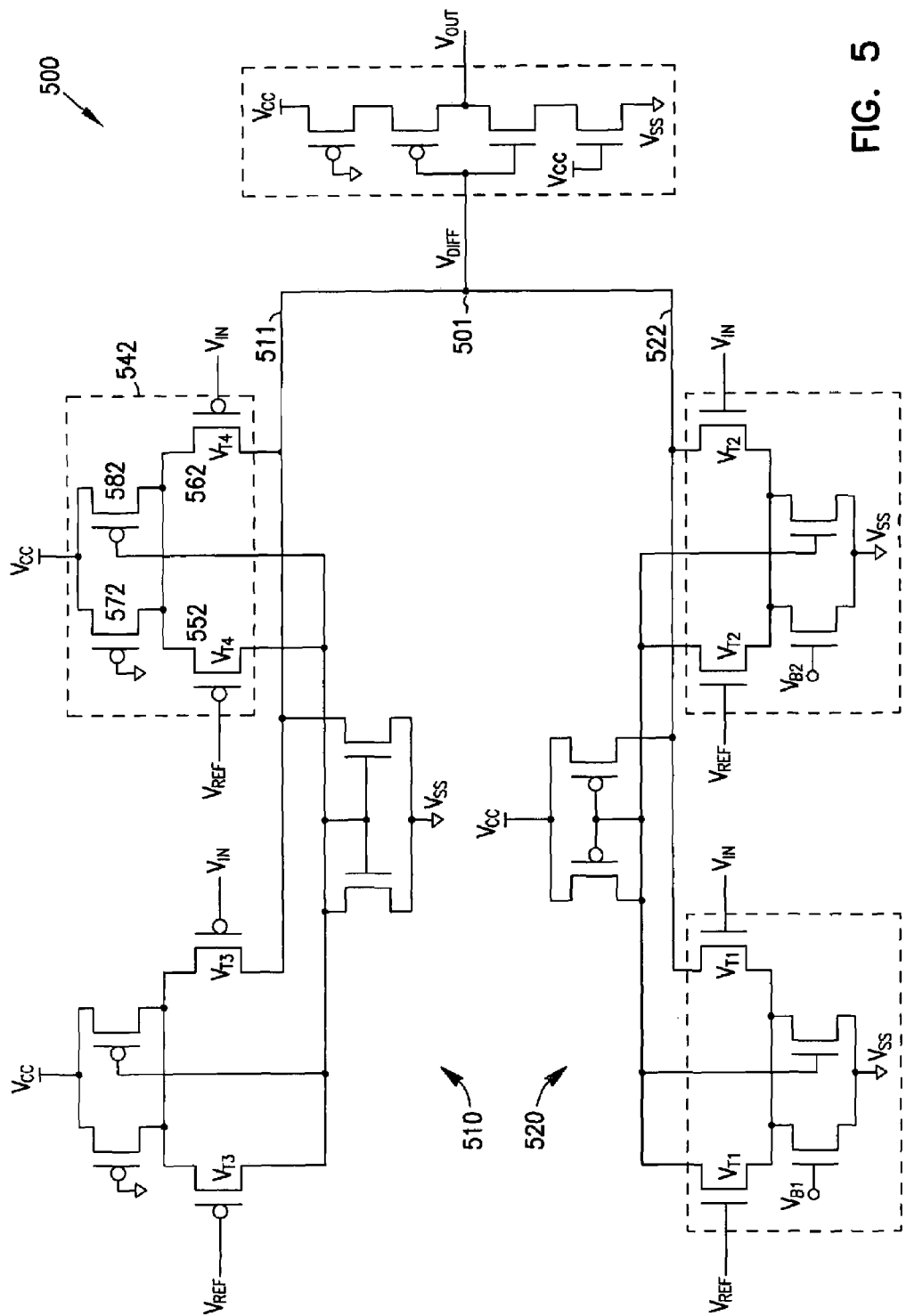
FIG. 5 shows an input buffer having multiple differential amplifiers with a symmetrical arrangement.

FIG. 5 shows an input buffer having multiple differential amplifiers with a symmetrical arrangement. Input buffer 500 includes a p-channel differential amplifier 510 and an n-channel differential amplifier 520. In some embodiments, input buffer 500 corresponds to input buffer 100 of FIG. 1. In other embodiments, input buffer 500 corresponds to input buffer 300 of FIG. 3. In FIG. 5, differential amplifiers 510 and 520 response to input signals $V_{REF}$ and $V_{IN}$ to provide the $V_{DIFF}$ signal at a combined output node 501. Node 501 is formed by a combination of an output node 511 of differential amplifier 510 and an output node 522 of differential amplifier 520. Output unit 530 generates the $V_{OUT}$ based on the $V_{DIFF}$ signal.

In comparison with input buffer 300 of FIG. 3, input buffer 500 of FIG. 5 differs from input buffer 300 in that input buffer 500 includes an additional switching circuit 542 in differential amplifier 510. Switching circuit 542 includes a pair of input transistors 552 and 562 having a threshold voltage $V_{T4}$, and a bias unit formed by bias transistors 572 and 582. The inclusion of the additional switching circuit 542 may further improve the symmetry of input buffer 500.

In FIG. 5, the threshold voltages $V_{T1}$ and $V_{T2}$ have different values. The threshold voltages $V_{T3}$ and $V_{T4}$ also have different values. $V_{T1}$ is greater than $V_{T2}$, and $V_{T3}$ is greater than $V_{T4}$. In some embodiments, each of the $V_{T1}$ and $V_{T3}$ is about 0.68 volt, and each of the $V_{T2}$ and $V_{T4}$ is about 0.4 volt.

Figure 6:
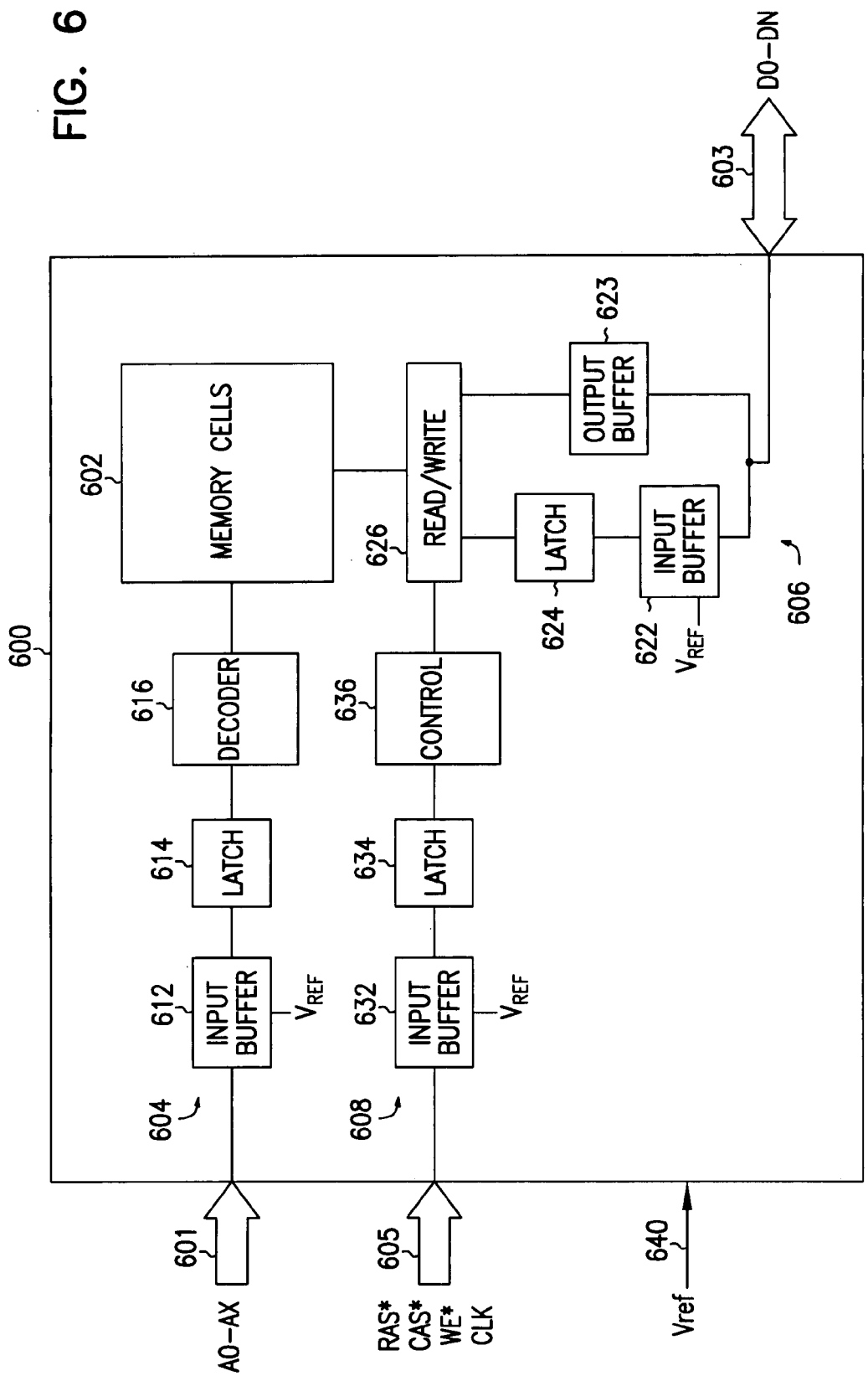
FIG. 6 shows a memory device according to an embodiment of the invention.

FIG. 6 shows a memory device 600 according to an embodiment of the invention. Memory 600 includes a plurality of address lines 601 for receiving a plurality of address signals AO-AX, a plurality of data lines 603 for transferring a plurality of data signals DO-DN, and a plurality of control lines 605 for receiving a plurality of control signals. An example of the control signals include, row access strobe (RAS*), column access strobe (CAS*), write enable (WE*), and clock (CLK). In some embodiments, the address, data, and control lines 601, 603, and 605 represent external pins of memory device 600.

Memory device 600 further includes a plurality of memory cells 602 for storing data. Memory cells 602 connect to an address path 604, a data path 606, and a control path 608. Address path 604 includes an input buffer 612, a latch 614, and a decoder 616. Data path 606 includes an input buffer 622, a latch 624, an output buffer 623, and a data read/write circuit 626. Control path 608 includes an input buffer 632, a latch 634, and a control circuit 636. Address path 604 connects to address lines 601 to operate on one of the address signals AO-AX. Data path 606 connects to data lines 603 to operate on one of the data signals DO-DN. Control path 608 connects to control lines 605 to operate on one of the control signals, for example, RAS*, CAS*, and WE*.

Memory device 600 further includes other address paths, data paths, and control paths that are similar to address path 604, data path 606, and control path 608. The other address, data, and control paths also connect to address, data, and control lines 601, 603, and 605 in similar fashions as address path 604, data path 606, and control path 608. However, for clarity, FIG. 6 shows only one of each of the address, data, and control paths.

Memory device 600 further includes a reference line 640 to provide a reference signal $V_{REF}$. The input buffer from each of the address, data, and control paths connects to line 640 to receive the $V_{REF}$ signal. In some embodiments, the $V_{REF}$ signal is provided to line 640 by a circuit or a device that is external to memory device 600. In other embodiments, the $V_{REF}$ signal is provided to line 640 by an internal circuit of memory device 600.

In operation, decode circuit 616 decodes the logic levels of the address signals AO-AX at latch 614 to identify a location of a selected memory cell, so that data can be read from or written into the selected memory cell. In some embodiments, decode circuit 616 includes a row decoder and a column decoder to decode a row address and a column address of the selected memory cell. Control circuit 636 decodes the logic levels of the control signals RAS*, CAS*, and WE* at latch 634 to determine whether a read or a write operation will be performed. Read/write circuit 626 reads data from the selected memory cell during a read operation, and writes data into the selected memory cell represented by the DO-DN signals at latch 624 during a write operation.

In some embodiments, at least one of the input buffers 612, 622, and 632 includes input buffers 100, 300, and 500 described in FIG. 1 through FIG. 5. In these embodiments, the $V_{IN}$ signal of input buffers 100, 300, and 500 corresponds to one of the of address signals AO-AX, data signals DO-DN, and control signals, RAS*, CAS*, and WE*. The $V_{REF}$ signal described in FIG. 1 through FIG. 5 corresponds to the $V_{REF}$ signal in FIG. 6.

In memory device 600, each of the input buffers on the address, data, and control paths 604, 606, and 608 receives the $V_{REF}$ signal and a corresponding signal from the address, data, and control paths. Similarly to the operations of input buffers 100, 300, and 500 described in FIG. 1 through FIG. 5, the input buffers of memory device 600 compare the voltage difference between the $V_{REF}$ signal and each of the address, data, and control signals to provide output signals to latches 614, 624, and 634. The output signals represent the value (logic one and logic zero) the address, data, and control signals. Address, data, and control paths 604, 606, and 608 perform memory access functions to access memory cells 602 based on the output signals provided to latches 614, 624, and 634.

As discussed in FIG. 1 through FIG. 5, input buffers 100, 300, and 500 are constructed to operate at a relatively low supply voltage and a wide voltage range of the $V_{REF}$ signal while allowing the output signal to have an improved falling and rising times. Thus, when input buffers 100, 300, and 500 are used as input buffers 612, 622, and 632 of memory device 600 of FIG. 6, input buffers 612, 622, and 632 also operate at a relatively low supply voltage and a wide voltage range of the $V_{REF}$ signal. Input buffers 612, 622, and 632 also allow the output signals (provided to latches 614, 624, and 634) to have improved falling and rising times, leading to an overall improvement for memory device 600.

In some embodiments, memory device 600 is a dynamic random access memory (DRAM) device, for example, a double data rate dynamic random access memory device. In some embodiments, memory device 600 operates at a speed of 2.0 gigahertz (GHz) or more. In other embodiments, memory device 600 operates at a speed of about 3.2 GHz.

In other embodiments, memory device 600 is a static random access memory (SRAM) device. In some other embodiments, memory device 600 is a flash memory device.

A person skilled in the art recognizes that memory device 600 is simplified to illustrate a memory device according to an embodiment of the present invention. Therefore, some features of a memory device are omitted from memory device 600 of FIG. 6.

Figure 7:
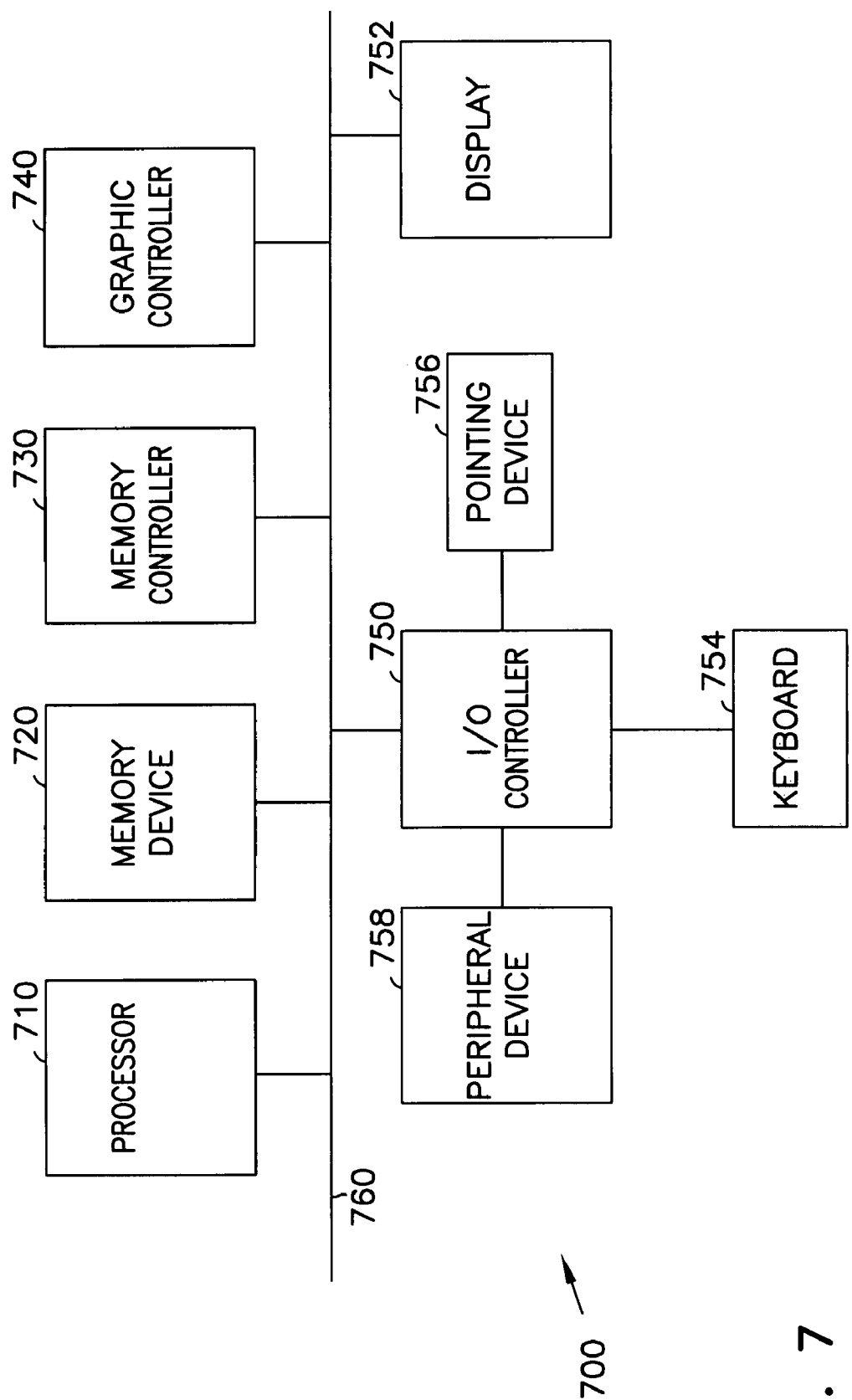
FIG. 7 shows a system according to an embodiment of the invention.

FIG. 7 shows a system 700 according to embodiments of the invention. System 700 includes devices such as a processor 710, a memory device 720, a memory controller 730, a graphic controller 740, an input and output (I/O) controller 750, a display 752, a keyboard 754, a pointing device 756, and a peripheral device 758. A connection 760 allows the devices of system to communicate with each other. Two or more devices shown in system 700 may be formed in a single chip. In some embodiments, system 700 may omit one or more devices shown in FIG. 7.

Connection 760 may include one or more separate buses. Connection 760 may be conducting traces on a circuit board or may be one or more cables. Bus 760 may also be wireless means such as electromagnetic radiation (e.g., radio waves).

In some embodiment, connection 760 includes one or more multi-drop buses.

In other embodiments, connection 760 includes one or more point-to-point buses. In some other embodiments, connection 760 includes a mix of multi-point and point-to-point buses. Therefore, a connection between the devices in system 700 may be a multi-point bus or a point-to-point bus. For example, memory device 720 may be coupled to processor 710 via a multi-point bus. However, memory device 720 may also be coupled to processor 710 via a point-to-point bus instead of a multi-point bus.

Peripheral device 758 may be a printer, an optical device (e.g., a CD-ROM device or a DVD device), a magnetic device (e.g., floppy disk driver), or an audio device (e.g., a microphone). Memory device 720 may be a dynamic random access memory (DRAM) device, a static random access memory (SRAM) device, or a flash memory device, or a combination thereof.

At least one of the devices shown in system 700 includes embodiments of an input buffer such as input buffers 100, 300, and 500 described in FIG. 1 through FIG. 5.

System 700 of FIG. 7 includes computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

CONCLUSION

Various embodiments of the present invention provide circuits and methods involving input buffers. The input buffers of the embodiments of the present invention operate with a relatively low supply voltage and an improved range of signal swing of the input signals while improving the symmetry between falling and rising signal transitions of the output signals. The input buffers of the embodiments of the present invention may be used in electrical devices such as memory devices and processors.

Some embodiments include an input buffer having a first differential amplifier including a pair of input nodes, a second differential amplifier sharing the pair of input nodes with the first differential amplifier. At least one of the differential amplifiers includes a pair of first transistors and a pair of second transistors. The first transistors and the second transistors receive the same input signals from the pair of input nodes. The threshold voltage of the first transistors is different from the threshold voltage of the second transistors. The input buffer further includes a combined output node for providing an output signal based on the input signals. The combined output node is formed by a combination of an output node of the first differential amplifier and an output node of the second differential amplifier.

Other embodiments include a method of generating an output signal based on a combination of an input signal and a reference signal. The method uses both a first different amplifier and a second differential amplifier to compare the input signal and the reference signal. At least one of the differential amplifiers uses two separate pairs of transistors for receiving the input and reference signals. The transistors in one of the pairs have a threshold voltage lower than a threshold voltage of the transistor in the other pair. The method generates the output signal based on the comparison results from both of the first and second differential amplifiers.

Some other embodiments of the present invention will be apparent upon reading the present application including the drawings and claims.

It is to be understood that the above description is intended to be illustrative, and not restrictive. Many other embodiments will be apparent to those of skill in the art upon reading and understanding the above description. Therefore, the scope of the invention should be determined with reference to the appended claims, along with the full scope of equivalents to which such claims are entitled.

What is claimed is:

1. A memory device comprising:
   memory cells; and
   a circuit path coupled to the memory cells, the circuit path including an input buffer, the input buffer including a first circuit and a second circuit, the first and second circuits having a combined output node, wherein each of the first and second circuits includes:
   a pair of load transistors having a shared source coupled to a first supply node, a shared gate, a first drain coupled to the shared gate, and a second drain coupled to the combined output node;
   a pair of first transistors having a first gate coupled to a first input node, a second gate coupled to a second input node, a first drain coupled to the shared gate of the load transistors, a second drain coupled to the combined output node, and a shared source; and
   a first bias unit coupled to the shared source and to a second supply node.

2. The memory device of claim 1, wherein the first circuit includes:
a pair of second transistors having a first gate coupled to the first input node, a second gate coupled to the second input node, a first drain coupled to the shared gate of the load transistors of the first circuit, a second drain coupled to the combined output node, and a shared source; and
a second bias unit coupled to the shared source of the second transistors of the first circuit and to the second supply node.

3. The memory device of claim 1, wherein within each of the first and second circuits, the first bias unit includes a bias transistor having a drain coupled to the shared source of the first transistors, a gate coupled to the shared gate of the load transistors, and a source coupled to the second supply node.

4. The memory device of claim 3, wherein within each of the first and second circuits, the first bias unit includes an additional bias transistor having a drain coupled to the shared source of the first transistors, a source coupled to the second supply node, and a gate coupled to a bias node for receiving a bias voltage.

5. The memory device of claim 2, wherein the second bias unit includes a bias transistor having a drain coupled to the shared source of the second transistors of the first circuit, a gate coupled to the shared gate of the load transistors of the first circuit, and a source coupled to the second supply node.

6. The memory device of claim 5, wherein the second bias unit includes an additional bias transistor having a drain coupled to the shared source of the second transistors, a source coupled to the second supply node, and a gate couple to a bias node for receiving a bias voltage.

7. The memory device of claim 1, wherein the second circuit includes:
a pair of second transistors having a first drain coupled to the shared gate of the load transistors of the second circuit, a second drain coupled to the combined output node, and a shared source; and
a second bias unit coupled to the shared source of the second transistors of the second circuit and to the second supply node.

8. The memory device of claim 1, wherein the each of the first transistors of the first circuit has a first threshold voltage, wherein each of the second transistors of the first circuit has a second threshold voltage, and wherein the second threshold voltage is lower than the first threshold voltage.

9. The memory device of claim 8, wherein the first threshold voltage is about 0.68 volt.

10. The memory device of claim 9, wherein the second threshold voltage is about 0.4.

11. The memory device of claim 1, wherein the first transistors and the second transistors of the first circuit have an identical transistor type.

12. The memory device of claim 1, wherein the first transistors of the first circuit have a first transistor type, and wherein the first transistors of the second circuit have a second transistor type.

13. A memory device comprising:
memory cells; and
a circuit path coupled to the memory cells, the circuit path including an input buffer, the input buffer including:
a first differential amplifier including a pair of input nodes;
a second differential amplifier sharing the pair of input nodes with the first differential amplifier, the second amplifier including a pair of first transistors with gates coupled to the pair of input nodes, and a pair of second transistors with gates coupled to the pair of input nodes; and
a combined output node to provide an output signal based on a pair of input signals at the pair of input nodes, wherein the combined output node is formed by a combination of an output node of the first differential amplifier and an output node of the second differential amplifier.

14. The memory device of claim 13, wherein each of the first transistors has a first threshold voltage, wherein each of the second transistors has a second threshold voltage unequal to the first threshold voltage.

15. The memory device of claim 14, wherein the first threshold voltage is a fraction of the second threshold voltage.

16. The memory device of claim 13, wherein the first differential amplifier includes a pair of first transistors having gates coupled to the pair of input nodes.

17. The memory device of claim 16, wherein the first differential amplifier includes a pair of second transistors having gates coupled to the pair of input nodes.

18. The memory device of claim 13, wherein the first and second differential amplifiers are to switch the output signal from a first signal level to a second signal level when a voltage level at the first input node is higher than a voltage level at the second input node.

19. The memory device of claim 18, wherein the first and second differential amplifiers are to switch the output signal from the second signal level to the first signal level when the voltage level at the first input node is lower than the voltage level at the second input node.

20. The memory device of claim 13, wherein the first and second differential amplifiers are to operate with a supply voltage of in a range of about 1.2 volts to about 1.7 volts.

21. The memory device of claim 13, wherein the first and second differential amplifiers are to receive the pair of input signals with a signal of the pair of input signals having a voltage level in a range of about 0.6 volts to about 1.1 volts.

22. A system comprising:
a processor; and
a memory device coupled to the processor, the memory device including:
memory cells; and
a circuit path coupled to the memory cells, the circuit path including an input buffer, the input buffer including a first circuit and a second circuit, the first and second circuits having a combined output node, wherein each of the first and second circuits includes:
a pair of load transistors having a shared source coupled to a first supply node, a shared gate, a first drain coupled to the shared gate, and a second drain coupled to the combined output node;
a pair of first transistors having a first gate coupled to a first input node, a second gate coupled to a second input node, a first drain coupled to the shared gate of the load transistors, a second drain coupled to the combined output node, and a shared source; and
a first bias unit coupled to the shared source and to a second supply node; and
a display coupled to the processor and the memory device.

23. The system of claim 22 comprising a point-to-point bus coupled between the processor and the memory device.

24. The system of claim 22 comprising a multi-point bus coupled between the processor and the memory device.

25. A method comprising:
applying a first input signal and a second input signal to a first different amplifier;
applying the first and second input signals to a pair of first transistors of a second differential amplifier;
applying the first and second input signals to a pair of second transistors of the second differential amplifier; and
generating an output signal at a combined output node the first and second differential amplifiers in response to the first and second input signals.

26. The method of claim 25, wherein the first and second differential amplifiers switch the output signal from a first signal level to a second signal level when a signal level of the first input signal is higher than a signal level of the second input signal.

27. The method of claim 26, wherein the first and second differential amplifiers switches the output signal from the second signal level to the first signal level when the signal level of the first input signal is lower than the signal level of the second input signal.

28. The method of claim 25, wherein the second input signal remains at a selected signal level and the first input signal switches between a first signal level and a second signal level, and wherein the first signal level is higher than the selected signal level and the second signal level is lower than the selected signal level.

29. The method of claim 28, wherein the first signal level is about 75 millivolts to about 500 millivolts higher than the selected signal level, and wherein the second signal level is about 75 millivolts to about 500 millivolts lower than the selected signal level.

30. The method of claim 25, wherein the output signal switches from a first signal to a second signal level in with rising time, wherein the output signal switches from the second signal to the first signal level with a falling time, and wherein a difference between the rising time and the falling time is less than 200 picoseconds.

* * * * *